United States Patent [19]
Pei

[11] Patent Number: 6,116,936
[45] Date of Patent: Sep. 12, 2000

[54] ELECTRICAL CONNECTOR

[75] Inventor: Wen-Chun Pei, Taipei, Taiwan

[73] Assignee: Hon Hai Precision Ind. Co., Ltd., Taipei Hsien, Taiwan

[21] Appl. No.: 09/364,247

[22] Filed: Jul. 29, 1999

[30] Foreign Application Priority Data

Apr. 16, 1999 [TW] Taiwan ................................. 88205882

[51] Int. Cl.[7] .............................................. H01R 13/625
[52] U.S. Cl. ........................................................ 439/342
[58] Field of Search ........................... 439/342, 259–270

[56] References Cited

U.S. PATENT DOCUMENTS

| | | | |
|---|---|---|---|
| 4,420,205 | 12/1983 | Kirkman | 439/342 |
| 4,538,870 | 9/1985 | Thewlis | 439/342 |
| 5,649,836 | 7/1997 | Kashiwagi | 439/342 |

*Primary Examiner*—Gary F. Paumen
*Attorney, Agent, or Firm*—Wei Te Chung

[57] ABSTRACT

An electrical connector assembly comprises a cover, a base having a number of conductive terminals received therein, and a cam mechanism for driving the cover along the base. The cover provides a number of standoffs for distancing a mounting face of the base from a printed circuit board. The cam mechanism comprises a cam including a lower column and an upper column stacked together with axes thereof being offset from each other a predetermined distance, a locking spring, and an opening and a recess respectively defined in the cover and the base for receiving the cam and the spring. The lower column defines a pair of notches spanning an arc of approximately 90 degrees around a periphery thereof. When the cam rotates in the recess of the base, the spring moves between the pair of notches and the upper column moves in the opening of the cover to drive the cover along the base.

10 Claims, 9 Drawing Sheets

ELECTRICAL CONNECTOR

BACKGROUND OF THE INVENTION

The present invention relates to a zero insertion force connector, and particularly to a zero insertion force connector having a mechanism for reliably positioning a cover thereof on a base thereof.

Taiwan Patent Application No. 85107705 discloses a zero insertion force connector comprising a cover, a base, a plurality of terminals received in the base and a cam. The cam comprises a lower column and an upper column stacked together with axes thereof being offset from each other a predetermined distance. The cam is assembled between the base and the cover. When the cam rotates, the cover is driven to slide along the base whereby tail portions of pins of an electronic component mounted on the cover electrically engage with and disengage from the terminals of the connector.

However, the cam does not include a feature to determine whether or not the tail portions of the pins are reliably connected with the terminals. Additionally, the cam cannot reliably secure the tail portions with the terminals because the base may become disengaged from the cover as a result of vibrations and external forces. Hence, an improved electrical connector is required to overcome the disadvantages of the prior art.

BRIEF SUMMARY OF THE INVENTION

A first object of the present invention is to provide an electrical connector having a mechanism for indicating whether or not pins of a chip are reliably connected with terminals of the connector.

A second object of the present invention is to provide an electrical connector having a mechanism for retaining the connector at a stable state.

Accordingly, an electrical connector assembly comprises a cover, a base having a plurality of conductive terminals received therein, and a cam mechanism for driving the cover along the base. The cam mechanism comprises a cam including a lower column and an upper column stacked together with axes thereof being offset from each other a predetermined distance, a locking spring, and an opening and a recess respectively defined in the cover and the base for receiving the cam and the spring. The lower column defines a pair of notches spanning an arc of approximately 90 degrees along a periphery thereof. When the cam rotates in the recess, the spring moves between the pair of notches and the upper column moves in the opening to drive the cover along the base.

Other objects, advantages and novel features of the invention will become more apparent from the following detailed description of the present embodiment when taken in conjunction with the accompanying drawings.

DETAILED DESCRIPTION OF THE INVENTION

Figure 1:
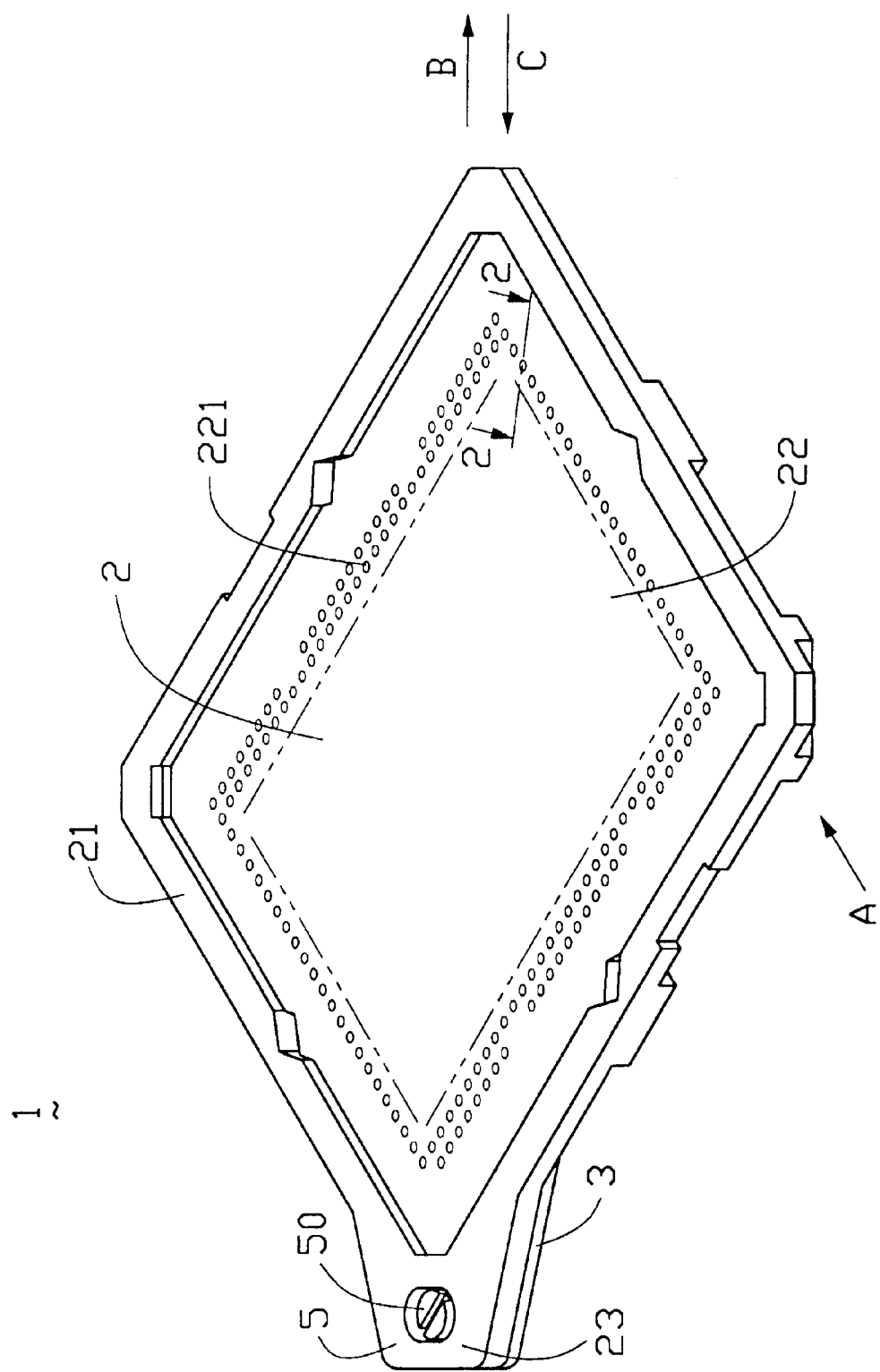
FIG. 1 is a perspective view of an electrical connector in accordance with a first embodiment of the present invention.
Figure 2:
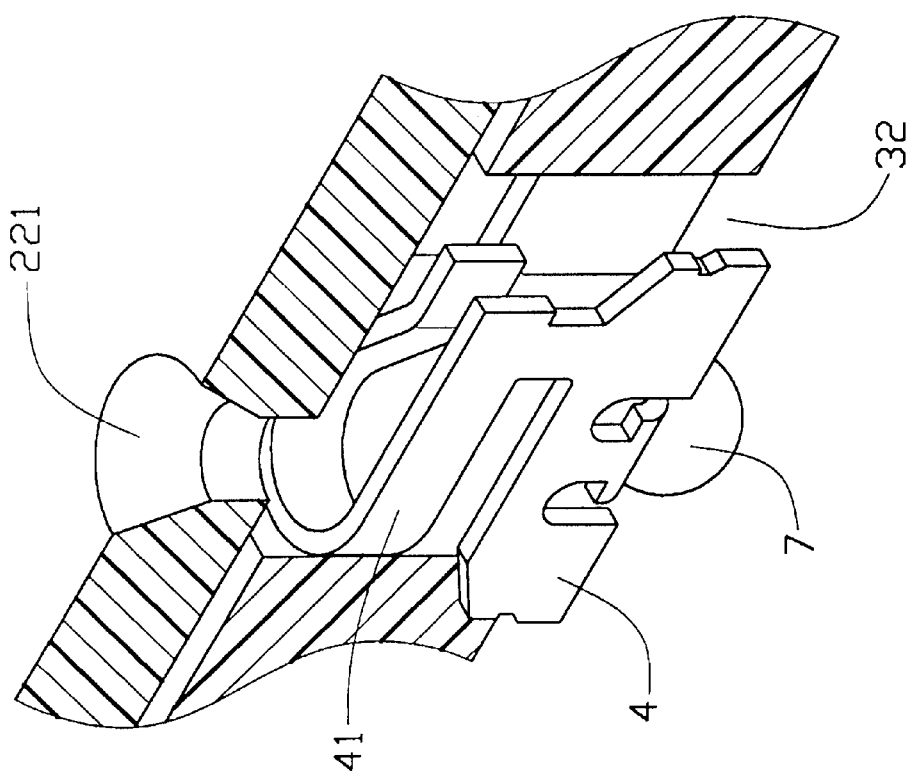
FIG. 2 is a cross-sectional view of the connector taken along line 2—2 of FIG. 1 illustrating a terminal of the electrical connector at a disengaged state.
Figure 3:
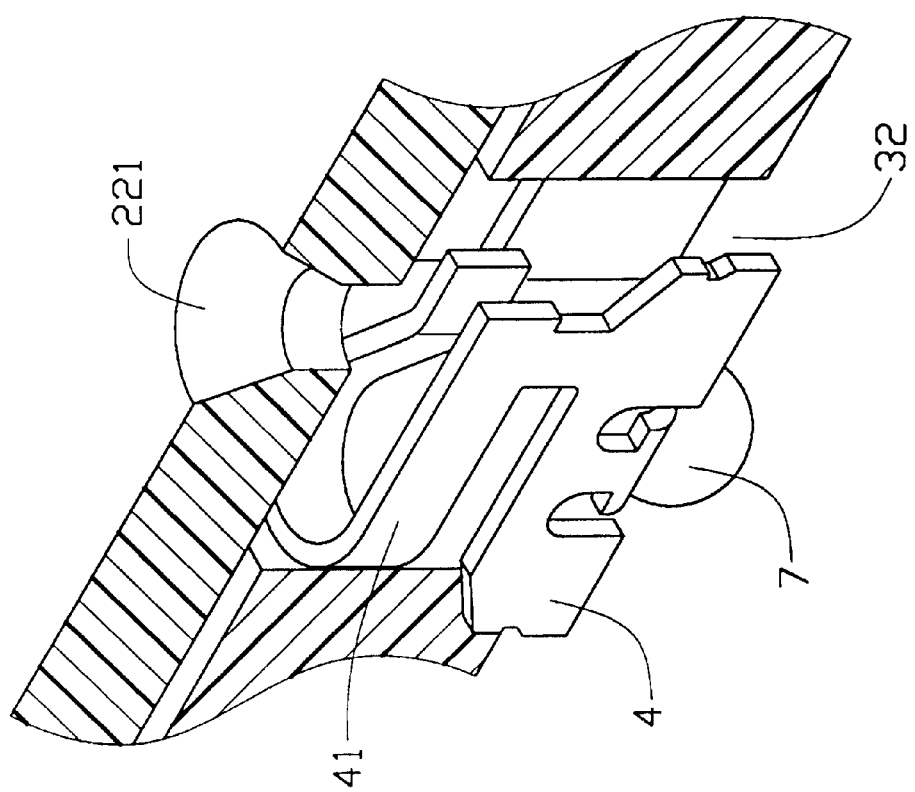
FIG. 3 is similar to FIG. 2 but illustrating the terminal at an engaged state.
Figure 9:
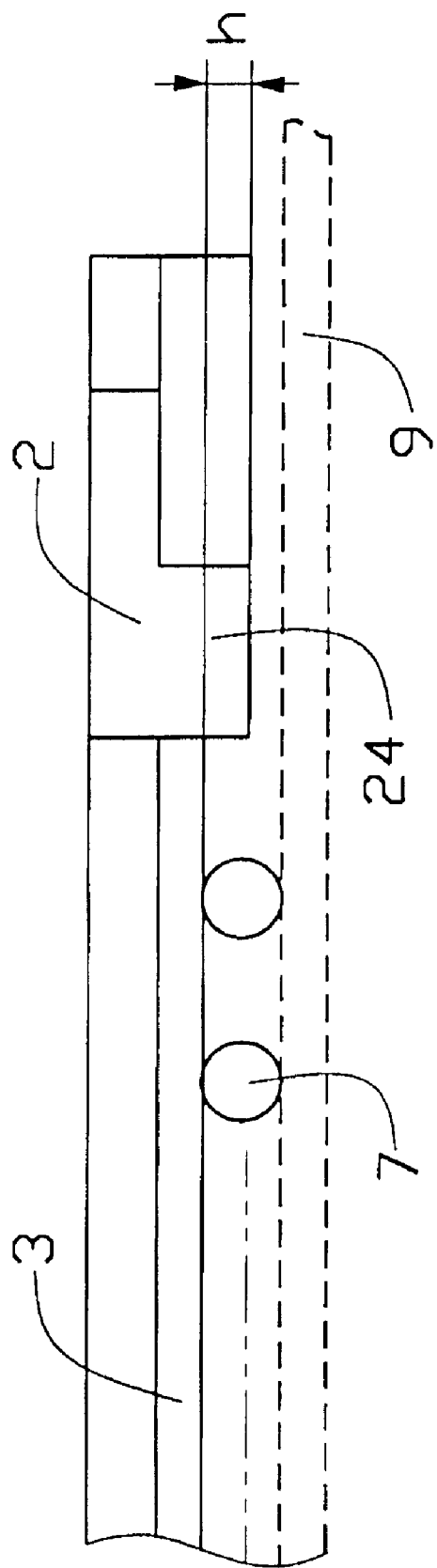
FIG. 9 is a partial planar view of FIG. 1 looking in a direction indicated by arrow "A"

Referring to FIGS. 1–3, an electrical connector assembly 1 in accordance with the present invention is employed to electrically connect a chip (not shown) to a printed circuit board 9 (FIG. 9). The connector 1 comprises a cover 2, a base 3 having a plurality of conductive terminals 4 received therein, and a cam mechanism 5 positioned in a corner 23 thereof. The cover 2 defines a chamber 22 in a top face 21 thereof for receiving the chip, and a plurality of apertures 221 for receiving pins of the chip. The base 3 is mounted to the printed circuit board 9 by solder balls 7. The cam mechanism 5 is configured to drive the cover 2 along the base 3 in a direction indicated by arrow "B" and an opposite direction indicated by arrow "C".

Each terminal 4 comprises an elongate engaging portion 41 and is received in a cavity 32 (FIG. 5) of the base 3 with the engaging portion 41 oriented substantially parallel to the direction of "B". When the cover 2 is driven along the base 3 by the cam mechanism 5 from an open position to a closed position, tail portions of the pins of the chip disengage from the engaging portions 41.

Figure 4:
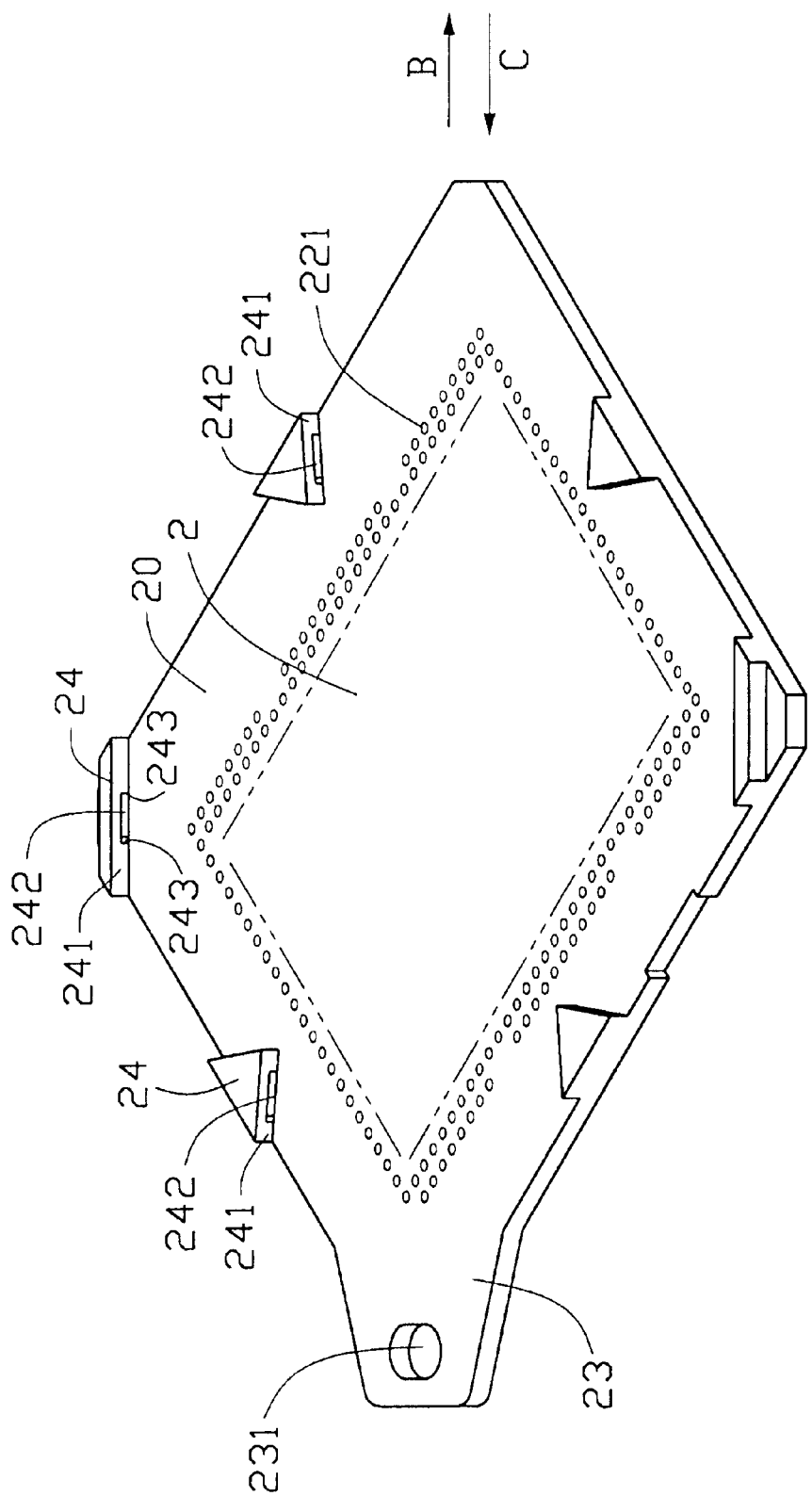
FIG. 4 is a bottom perspective view of a cover of the connector.
Figure 5:
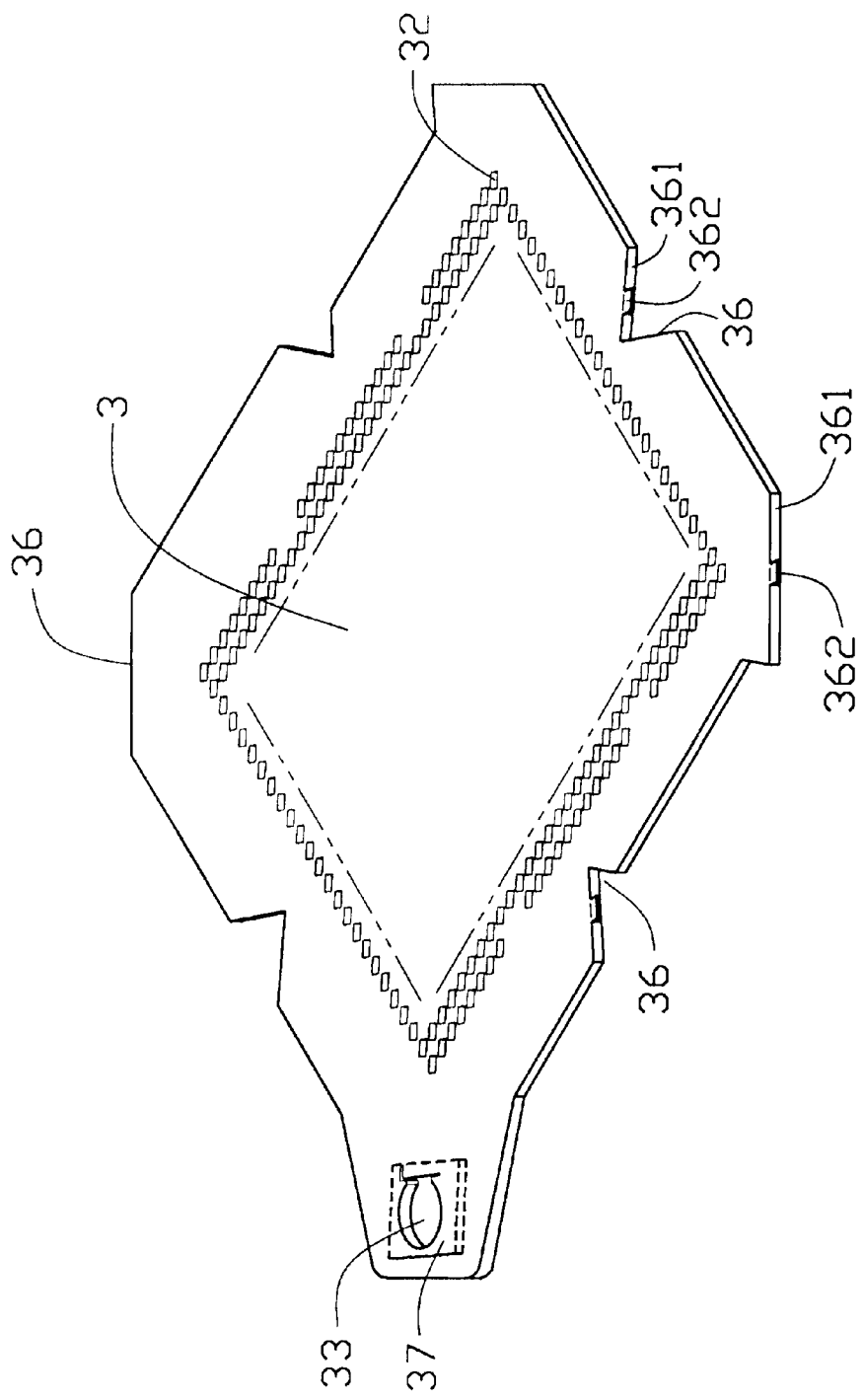
FIG. 5 is a top perspective view of a base of the connector.

Referring to FIGS. 4 and 5, the cover 2 forms a plurality of standoffs 24 on a bottom face 20 thereof. Two of the standoffs 24 are formed at opposite corners adjacent to the corner 23 on which the cam mechanism 5 is formed and the other standoffs 24 are positioned at middle portions of edges of the cover 2. Each standoff 24 has a flank 241 parallel to the direction of arrow "B". A channel 242 is defined in each flank 241. The base 3 defines a plurality of cutouts 36 corresponding to the standoffs 24. A projection 362 extends from a periphery 361 of each cutout 36, each periphery 361 being substantially parallel to the direction of arrow "B". Each projection 362 has the same height as the channel 242 and a shorter length than the channel 242 whereby the projections 362 are movably received in the channels 242 in the direction of arrow "B". The base 3 further forms a standoff 37 on a bottom surface thereof.

Figure 6:
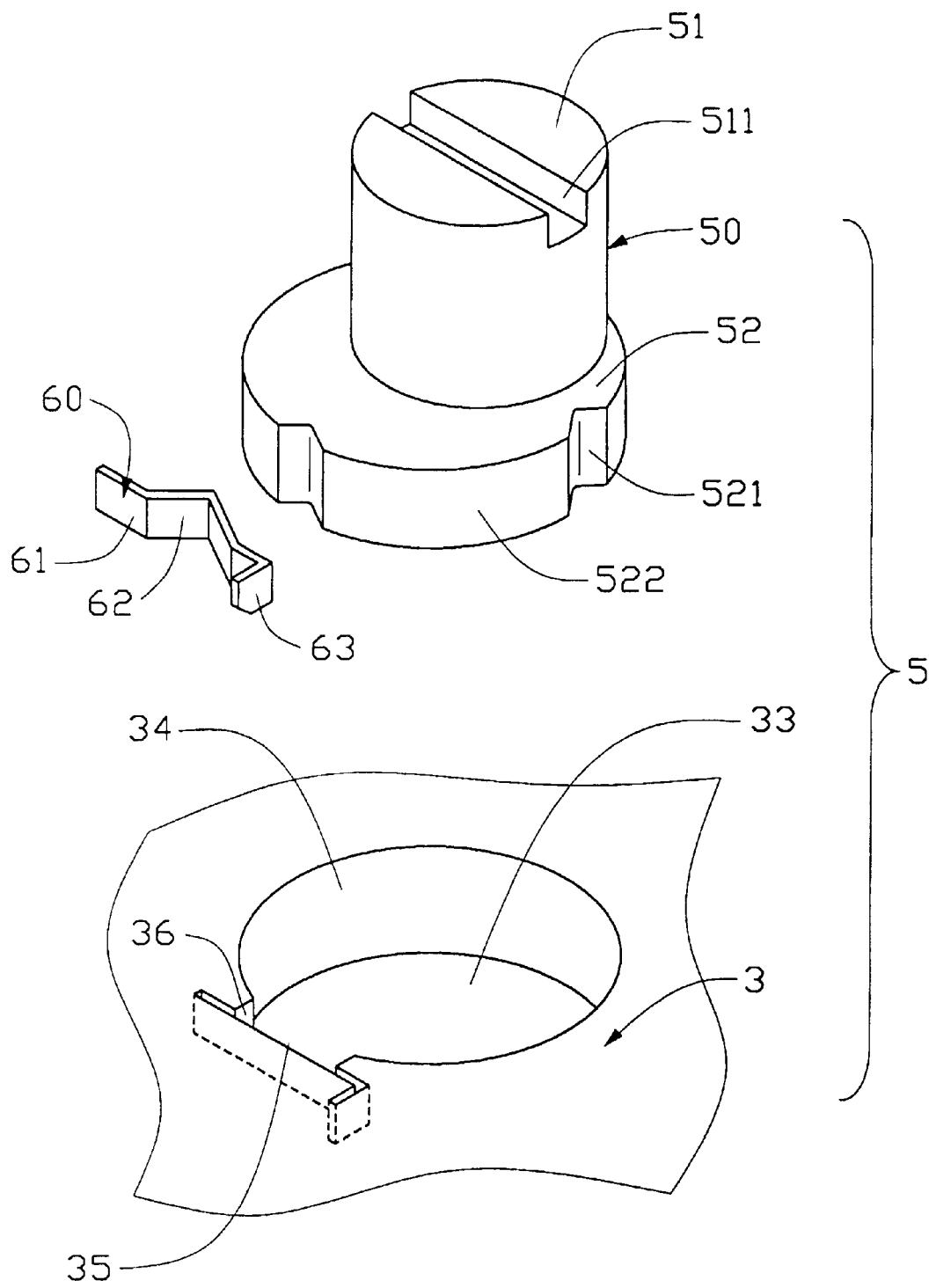
FIG. 6 is a partial, exploded view of a cam mechanism for sliding the cover along the base.

Also referring to FIG. 6, the cam mechanism 5 comprises a cam 50, a substantially L-shaped locking spring 60, and an opening 231 and a receiving recess 33 respectively defined in the corner 23 of the cover 2 and the base 3 for receiving the cam 50 and the spring 60. The receiving recess 33 comprises a concavity 34, a substantially L-shaped groove 35 proximate the concavity 34, and a gap 36 communicating between the groove 35 and the concavity 34. The spring 60 comprises a spire 62 bent towards the direction of "B" at a middle position thereof, a retention portion 63 perpendicularly bent at an end thereof, and a free end 61 at an opposite end thereof. The cam 50 comprises a lower column 52 and an upper column 51 positioned on the lower column 52 with axes thereof being offset from each other a predetermined distance. The upper column 51 defines a slot 511 in a top face thereof for rotating the cam 50 via an external tool such as a screw driver (not shown). The lower column 52 defines a pair of notches 521 in a periphery 522 thereof spanning an arc of approximately 90 degrees. In assembly, the spring 60 is positioned in the groove 35 with the retention portion 63 engaging with the groove 35 and the spire 62 extending into the concavity 34 through the gap 36. The lower column 52 of the cam 50 is positioned in the concavity 34 with the spire 62 received in one of the notches 521. The cover 2 is assembled on the base 3 whereby the upper column 51 is received in the opening 231 thereof and the standoffs 24 thereof are received in the corresponding cutouts 36 of the base 3 and extending a height "h" beyond the base 3 (FIG. 9). The peripheries 361 abut against the flanks 241 and the projections 362 are received in the channels 242 therefore so that the cover 2 can slide on the base 3 in the direction of arrows "B" and "C". The concavity 34 is slightly larger than the lower column 52 whereby the lower column 52 rotates in the concavity 34. The diameter/dimension of the opening 231 is substantially equal to the diameter of the upper column 51 in the direction of the arrow "B" but is greater than the diameter of the upper column 51 in a perpendicular direction relative to the arrow "B"; therefore, the upper column 51 is movable in the opening 231 in the perpendicular direction.

Figure 7:
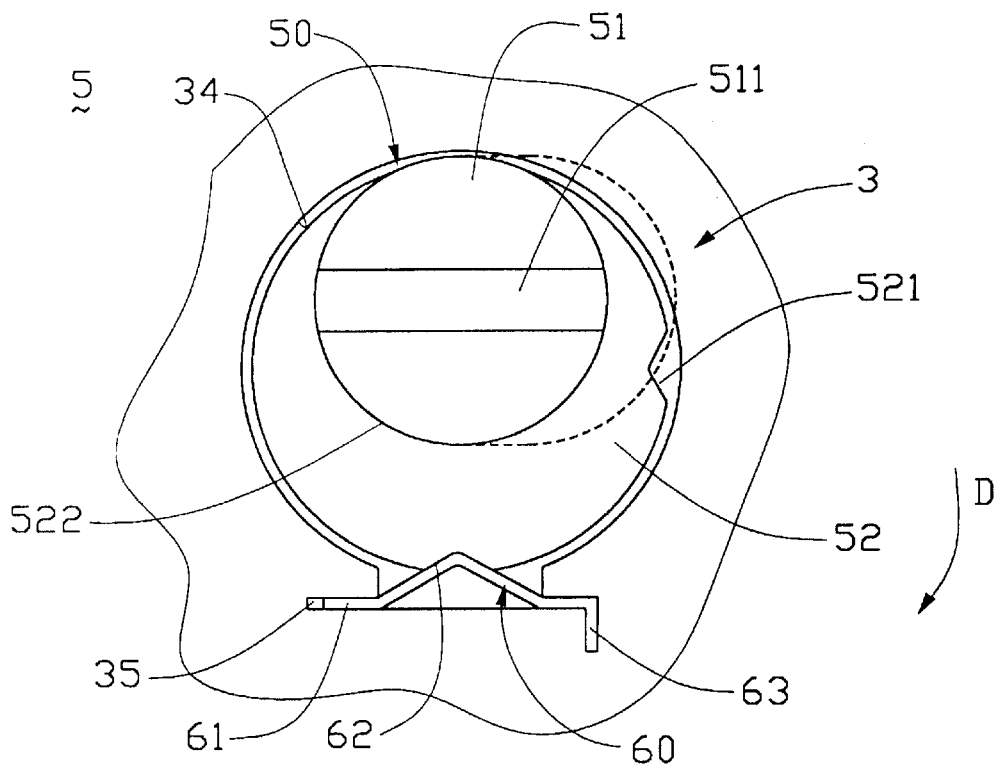
FIG. 7 is a partial, top view of the cam mechanism at an open state.
Figure 8:
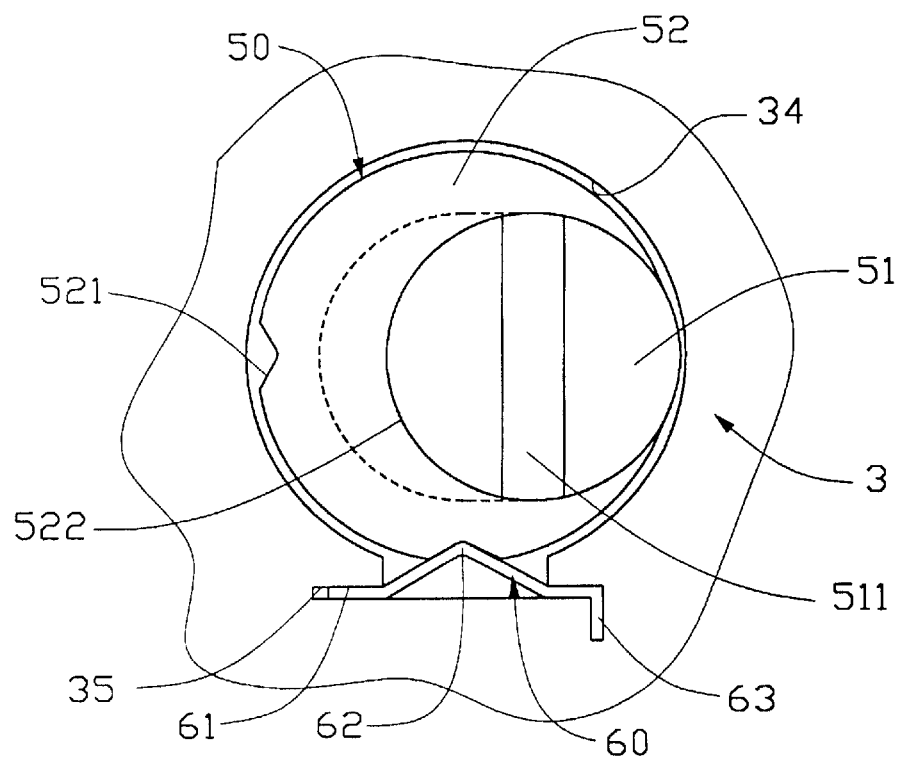
FIG. 8 is a view similar to FIG. 7 but illustrating the cam mechanism at a closed state.

Referring to FIGS. 7 and 8, in operation, the tool is inserted into the slot 511 to rotate the cam 50 in the concavity 34 between the open and closed positions. When the cam rotates in the direction of arrow "D", the cam 50 exerts a force on the spire 62 to stretch the spring 60 and cause the free end 61 thereof to move away from the retention portion 63 in the groove 35. The spire 62 then slides along the periphery 522 of the lower column 52 until being received in the other notch 521. At the same time, the upper column 51 moves in the opening 231 and abuts against a periphery of the opening 231 (shown in dotted lines) to move the cover 2 in the direction of arrow "B" and the projections 361 of the base 3 move in the channels 242 of the cover 2. During operation, the amount of resistance exerted on the cam 50 by the spring 60 varies thereby indicating whether or not the spire 62 is received in one of the notches 521 although the engagement can not be visually observed. Thus, the existence of a reliable connection between the tail portions of the pins of the chip and the terminals 4 can be readily concluded. When the cover 2 is positioned on the base 3 at the open position or the closed position, the resistance exerted on the cam 50 by the spring 60 will retain the position therebetween. Furthermore, the projections 362 received in the channels 242 abut against opposing walls 243 of the channels 242 to limit movement between the cover 2 and the base 3.

Referring to FIG. 9, when the connector assembly 1 is mounted on the printed circuit board 9, the solder balls 7 are positioned on the board 9 and the standoffs 24, 37 are distanced from the board 9. When heated, the solder balls 7 melt and the connector assembly 1 is displaced downward until at least three of the standoffs 24, 37 abut against the board 9. When cooled, the balls 7 electrically connect the terminals with circuit pads (not shown) of the board 9.

Figure 10:
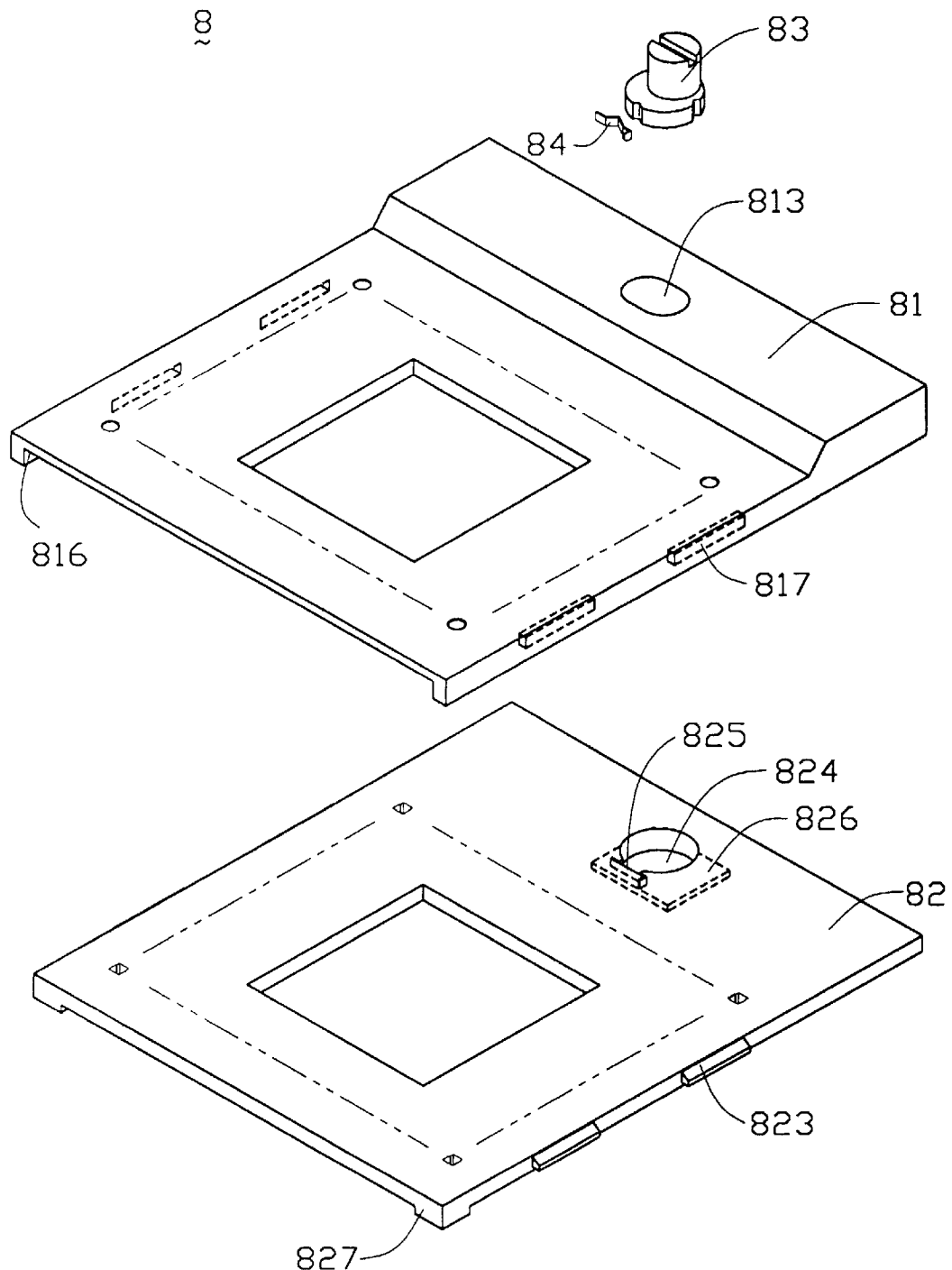
FIG. 10 is an exploded view of the electrical connector in accordance with a second embodiment of the present invention.

Referring to FIG. 10, a connector assembly 8 in accordance with a second embodiment of the present invention comprises a base 82, a cover 81 assembled to the base 82, and a cam mechanism. The cam mechanism, comprising a cam 83, a locking spring 84, an opening 813, a concavity 824 and a channel 825, is similar to the cam mechanism 5 of the first embodiment. The cover 81 forms a pair of bars 816 downwardly extending from opposite edges thereof for guiding the cover 81 to slide along the base 82. Each bar 816 defines a pair of slits 817 in an inner wall thereof. The base 82 forms a pair of flanges 823 on opposite edges thereof corresponding to the slits 817. The flanges 823 are slidably received in the corresponding slits 817 since each flange 823 is shorter than each slit 817. The base 82 forms a plurality of standoffs 827, 826 for distancing the connector assembly 8 from the printed circuit board 9.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
    a base defining a plurality of contact receiving cavities;
    a plurality of conductive terminals received in the cavities of the base;
    a cover comprising a plurality of apertures corresponding to the cavities of the base, the cover being slidably assembled to the base; and
    a cam mechanism comprising a cam, a locking member, an opening defined in the cover and a recess defined in the base, the cam being partially movable in the opening of the cover, the cam defining a pair of notches on a periphery thereof and being rotatably accommodated in the opening and the recess, the locking member being received in the recess of the base, the locking member being partially retained in a selected one of the notches of the cam.

2. The electrical connector as claimed in claim 1, wherein the cam comprises a lower column and an upper column respectively received in the recess of the base and the opening of the cover, axes of the first and upper columns being offset a predetermined distance from each other.

3. The electrical connector as claimed in claim 1, wherein the notches of the cam are angularly displaced approximately 90 degrees.

4. The electrical connector as claimed in claim 1, wherein the recess of the base comprises a substantially circular concavity, an L-shaped groove positioned proximate the concavity, and a gap communicating the concavity and the groove.

5. The electrical connector as claimed in claim 1, wherein the cam mechanism is positioned proximate a corner of the connector and the cover is movable along the base in a diagonal direction of the base.

6. The electrical connector as claimed in claim 5, wherein the base comprises a mounting face mounted on a printed circuit board, and wherein the cover provides a plurality of standoffs downwardly extending therefrom to stand off the mounting face of the base from the printed circuit board.

7. The electrical connector as claimed in claim 6, wherein each standoff comprises a flank parallel to the diagonal direction of the base and a channel defined in the flank.

8. The electrical connector as claimed in claim 7, wherein the base defines a plurality of cutouts corresponding to the standoffs and a projection is formed on a periphery of each cutout, the standoffs being received in corresponding cutouts and the projections being received in corresponding channels, each projection being shorter than each channel whereby the cover is movable along the base in two opposing directions.

9. An electrical connector comprising:

a base defining a plurality of contact receiving cavities;

a plurality of conductive terminals received within the cavities of the base;

a cover defining a plurality of apertures corresponding to the cavities of the base, the cover being slidably assembled to the base; and a cam mechanism comprising a cam, an opening defined in the cover and a recess defined in the base, said cam including a lower column received within the recess and an upper column received within the opening and further exposed to an exterior on a top portion of the cover with means for engaging an external tool for rotating the cam wherein the cam rotates along a fixed axis perpendicular to the cover and the base, the recess is dimensioned to snugly receive the lower column therein for rotation of the lower column along said fixed axis without radial movement of the lower column, while the opening is dimensioned to define a first dimension, along a movement direction of the cover, substantially equal to a diameter of the upper column, and a second dimension, along another direction perpendicular to said movement direction of the cover, substantially larger than the diameter of the upper column so that when the cam is rotated, the upper column not only urges the cover to move along the movement direction, but also slidably moves relative to the cover along said another direction.

10. An electrical connector comprising:

a base defining a plurality of contact receiving cavities;

a plurality of conductive terminals received within the cavities of the base;

a cover defining a plurality of apertures corresponding to the cavities of the base, the cover being slidably assembled to the base; and a cam mechanism comprising a cam, an opening defined in the cover and a recess defined in the base, said cam including a lower column received within the recess and an upper column received within the opening, said upper column defining a first center axis which is offset from a second center axis defined by the lower column, wherein the cam rotates along a fixed axis perpendicular to the cover and the base, which is generally same as the center axis of the lower column, and the recess is dimensioned to snugly receive the lower column therein for rotation of the lower column along said fixed axis without radial movement of the lower column, while the opening is dimensioned to define a first dimension, along a movement direction of the cover, substantially equal to a diameter of the upper column, and a second dimension, along another direction perpendicular to said movement direction of the cover, substantially larger than the diameter of the upper column so that when the cam is rotated, the upper column not only urges the cover to move along the movement direction, but also slidably moves relative to the cover along said another direction.

* * * * *